United States Patent [19]

Hendrix et al.

[11] Patent Number: 4,978,909
[45] Date of Patent: Dec. 18, 1990

[54] DEMODULATION CIRCUIT FOR AC MOTOR CURRENT SPECTRAL ANALYSIS

[75] Inventors: Donald E. Hendrix, Oak Ridge; Stephen F. Smith, Knoxville, both of Tenn.

[73] Assignee: Martin Marietta Energy Systems, Inc., Oak Ridge, Tenn.

[21] Appl. No.: 401,728

[22] Filed: Aug. 31, 1989

Related U.S. Application Data

[63] Continuation of Ser. No. 270,978, Nov. 14, 1988, abandoned.

[51] Int. Cl.$^5$ ............................................. G01R 23/16
[52] U.S. Cl. ............................ 324/77 B; 324/158 MG
[58] Field of Search ...................... 364/483, 485, 492; 318/490; 324/158 MG, 77 B, 77 R; 322/99; 340/648

[56] References Cited

U.S. PATENT DOCUMENTS

| | | | |
|---|---|---|---|
| 4,123,009 | 10/1978 | Kilpinen | 324/158 MG |
| 4,303,882 | 12/1981 | Wolfinger | 324/158 MG |
| 4,380,172 | 4/1983 | Iman et al. | 73/659 |
| 4,527,101 | 7/1985 | Zavis et al. | 318/490 |
| 4,542,649 | 9/1985 | Charbonneau et al. | 73/168 |
| 4,678,990 | 7/1987 | Bicknell et al. | 364/485 |
| 4,744,041 | 5/1988 | Strunk et al. | 318/490 |
| 4,773,263 | 9/1988 | Lesage | 73/659 |

FOREIGN PATENT DOCUMENTS

54-127509  10/1979  Japan .......................... 324/158 MG

OTHER PUBLICATIONS

Hargis et al., "The Detection of Rotor Defects in Induction Motors", IEE conf. Publ. 213, 1982, pp. 216-220.
Steele et al., "An Electrical Method of Monitoring Motors," ibid, 1982, pp. 231-235.
Franklin Research Center Report entitled "AM and FM Digital Modulation Technique for Electric Power," dated Feb. 1984.
Tavner et al., "Monitoring Generators and Large Motors," IEE Proceedings, vol. 133, Pt.B, No. 3, May 1986, pp. 169-180.
Patent Application Ser. No. 06/913,193, Howard D. Haynes et al., "Motor Current Signature Analysis Method for Diagnosing Motor Operating Devices," filed 09/30/86, pending as of 12/19/89.
Thomson et al., "An On-Line, Computer-Based Current Monitoring System for Rotor Fault Diagnosis in 3-Phase Induction Motors," reprinted from the Nov-Dec 1987 edition of Turbomachinery International, pp. 17-24.
Brochure entitled, "Induction Motor Fault Diagnosis," produced by Entek Scientific Corporation (Date unknown).

*Primary Examiner*—Hezron E. Williams
*Assistant Examiner*—Louis M. Arana
*Attorney, Agent, or Firm*—James M. Spicer; Bruce M. Winchell

[57] ABSTRACT

A motor current analysis method for the remote, noninvasive inspection of electric motor-operated systems. Synchronous amplitude demodulation and phase demodulation circuits are used singly and in combination along with a frequency analyzer to produce improved spectral analysis of load-induced frequencies present in the electric current flowing in a motor-driven system.

18 Claims, 7 Drawing Sheets

DEMODULATION CIRCUIT FOR AC MOTOR CURRENT SPECTRAL ANALYSIS

The United States Government has rights in this invention pursuant to contract with the Department of Energy.

This application is a continuation of application Ser. No. 270,978, filed Nov. 14, 1988 now abandoned.

FIELD OF THE INVENTION

The present invention generally relates to remote, noninvasive inspection of electric motor operated systems, and, more particularly, to demodulation circuits that result in improved spectral analysis of frequencies present in the electric current flowing through a motor driven system.

BACKGROUND OF THE INVENTION

A generalized system with which an embodiment of the present invention may be utilized is described with FIG. 1. Particular embodiments of the present invention are then discussed with reference to FIGS. 1-3.

Referring to FIG. 1, a motor 20 supplies motive power to a load 22. The power source supplying AC electrical power to the drive motor 20 in this illustration is assumed to be the nominal 60 Hz single-phase U.S. power line frequency.

The current transformer 24 and its associated termination resistor 26 are means typically used in the art to obtain a replica current on lead 28 that is proportional to the actual current supplied to the motor 20 in driving the load 22. It will also be recognized by those familiar with the art that the foregoing illustrates one representative way of obtaining a motor current signal that has impressed thereon extra frequency components indicative of normal and/or abnormal conditions in the motor driven load 22 and in the motor 20.

The motor current signal on lead 28, then, has various frequency components impressed thereon. Usually, the 60 Hz frequency of the AC power source will be the dominant frequency and the most readily detected. But, as is known in the art, there also exist few or many other frequencies in the motor current depending on the nature, condition, and operation of the load and motor at the time the motor current is sampled and analyzed.

Some of these extra, or additional, frequency components have been detected and used in the past. For example, sometimes they have been used to signal the operating condition of the load, or in other cases, to control the operating speed of the motor or provide some other desired control function. There is a need, however, for a means of detecting even lower level components that are present in the motor current signal for even further diagnosis or control, depending on the particular application.

The present inventors have realized that there are usually many additional load originated frequencies present in the current of operating electric motor driven systems, and that these can be used to provide a wealth of additional diagnostic information that has not previously been observed using prior art circuits. Indeed, the inventors have discovered that the imposed frequencies are the result of a modulation process whereby mechanical load variations impress amplitude and/or phase modulations on the motor load current, and it is their detection by synchronous amplitude demodulation and phase demodulation that most efficiently recovers them from the motor current signal.

SUMMARY OF THE INVENTION

Accordingly, it is one object of this invention to provide motor current spectral analysis employing synchronous AM demodulation means.

It is another object of this invention to provide motor current spectral analysis employing PM demodulation means.

It is yet another object of this invention to compare amplitude and phase demodulated motor current spectra to detect and identify frequencies present in a motor load current in addition to the fundamental line frequency.

These and other objects are achieved by the present invention which provides a method of obtaining frequency domain motor current signatures. The invention comprises the steps of amplifying a time domain motor current signal, synchronously AM demodulating said amplified signal to obtain a derived time domain motor current signal, low pass filtering said derived signal, amplifying said derived signal, and computing the frequency spectrum of said derived time domain motor current signal.

The method also encompasses the steps of amplifying a time domain motor current signal, PM demodulating said amplified signal to obtain a derived time domain motor current signal, low pass filtering said derived signal, amplifying said derived signal, and computing the frequency spectrum of said derived time domain motor current signal.

The method further comprises the step of comparing said synchronously AM demodulated frequency spectrum with said PM demodulated frequency spectrum. By such arrangement, difficult to detect and identify frequencies present in the motor load current may be displayed for analysis.

BRIEF DESCRIPTION OF THE DRAWINGS

FIG. 5b is an expanded portion of the frequency spectrum of FIG. 5a.

FIG. 6 is an AM demodulated frequency spectrum according to the present invention of the vacuum pump current probe of FIG. 5a.

FIG. 7 is a PM demodulated frequency spectrum according to the present invention of the vacuum pump current probe of FIG. 5a.

DETAILED DESCRIPTION OF THE PREFERRED EMBODIMENTS

Figure 1:
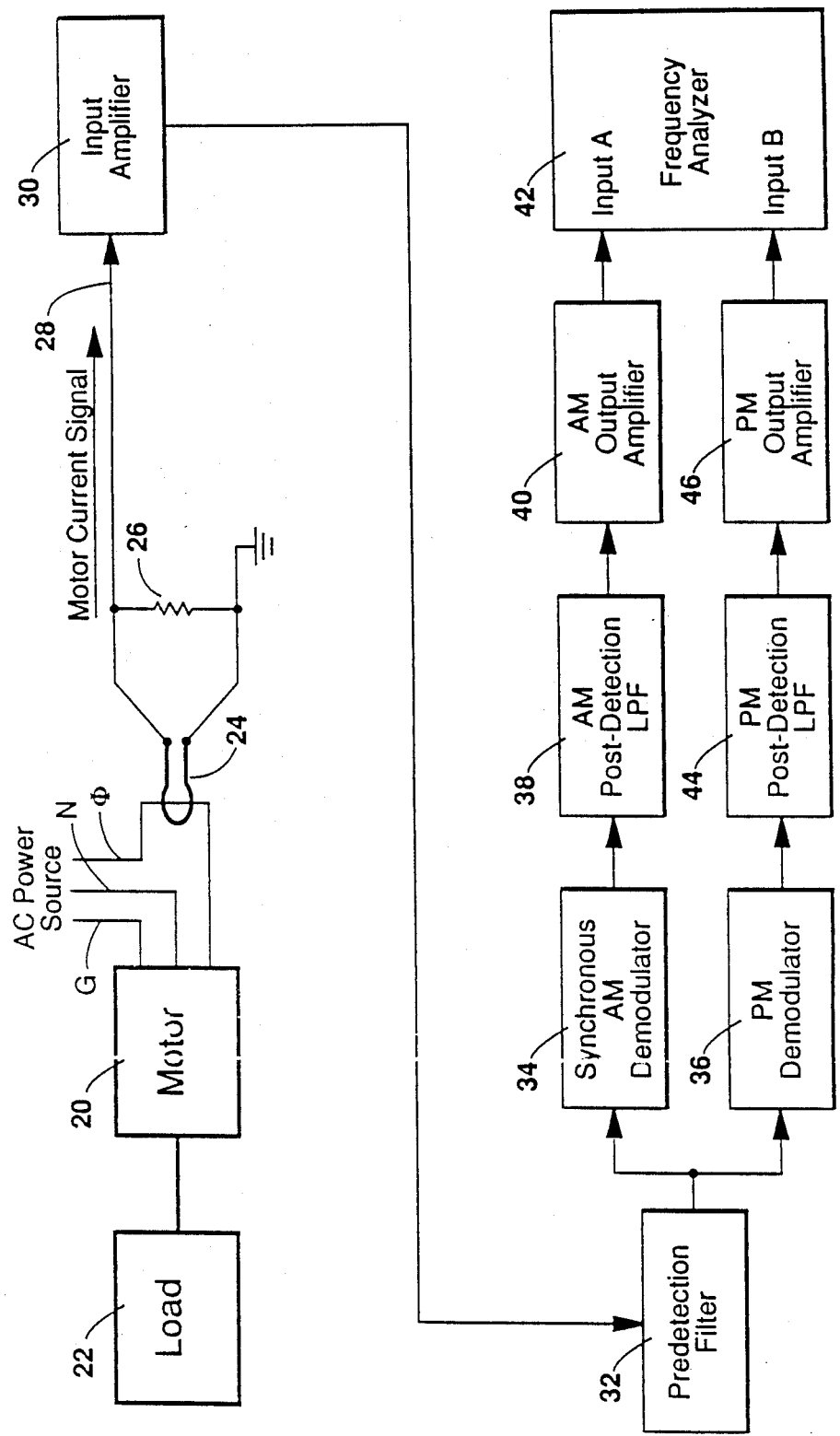
FIG. 1 is a schematic of a system incorporating the principles of the present invention for performing spectral analyses of an AC motor current signal.

Reference is now made to the present invention also illustrated in FIG. 1. In FIG. 1 the raw motor current signal containing the low-level frequencies of interest is routed to an input amplifier 30 via the lead 28. The input amplifier 30 provides amplification (gain) to the motor current signal before it goes to a predetection filter 32. The function of amplifier 30 is to obtain the signal level needed from the sampled motor current to provide appropriate drive levels to the following circuitry. Depending on the application, the input amplifier may be a differential amplifier to help reject power system or other (interference) frequencies extraneous to the desired measurement.

The predetection filter 32, like the input amplifier 30, is part of the signal conditioning that is used to prepare the motor current signal for the electronics which follow. The predetection filter 32 is an optional component which may remove extraneous parts of the motor current signal that are not desired in the measurement or which could interfere with the measurement or degrade its accuracy.

The motor current signal, now conditioned in the desired manner, is next presented to the inputs of a synchronous amplitude modulation (AM) demodulator 34 and to a phase modulation (PM) demodulator 36. The synchronous AM demodulator 34 demodulates the motor load current signal from filter 32 to extract the amplitude modulated components that had been impressed on that signal by the motor load variations.

The advantages of a synchronous (or "product") AM detector over the more basic nonsynchronous types are numerous and significant. The synchronous detector has a wider dynamic range than the other types (particularly nonsynchronous types such as the envelope and rectifier detector). Thus it can handle a wider input signal amplitude range with accurate results. The rectifier detector, for instance, will not function at all if its input signal is below the diode threshold voltage, and at slightly higher levels will still be very nonlinear. The synchronous detector also has substantially lower distortion of the recovered demodulated signals and thus provides a considerably more accurate spectrum when analyzed. Further, unlike the other forms, the synchronous form is inherently insensitive to quadrature or phase modulation components.

Synchronous detection also facilitates separation from the desired signal of unwanted spectral components such as power-line harmonics, spurious products, and other signals outside the band of interest. Synchronous detection also possesses major implementation advantages in polyphase systems. Finally, synchronous detectors are readily amendable to implementation as integrated circuit chips, particularly in the "switching"-type demodulator format.

Following AM demodulation, the time domain motor current signal next undergoes filtering in the AM post-detection low-pass filter 38. This is to remove unwanted frequencies typically generated by physically realizable AM detectors, principally the second harmonic of the power line frequency. The second harmonic is inherently generated in the action of the synchronous demodulator 34. The low-pass filtering process therefore removes this and other frequency components which would interfere with the accurate and reliable detection of the signals being sought.

The low-pass filtered AM demodulated signal is next amplified in AM output amplifier 40 since the levels, or amplitudes, of the signals of interest may have been extremely low. The amplification is usually necessary at this point to restore the levels of the desired signal to a convenient or useful level for introduction to the frequency analysis stage that follows.

The signal next goes to a frequency analyzer 42 where a frequency spectrum of the synchronously AM demodulated motor current signal is computed. It will be recognized that a Fourier transform or any other suitable mathematical method available in the frequency analyzer 42 may be selected. It is, however, essential to the present invention that a frequency analysis method be selected that presents to the user an array of frequencies which represent the signals contained in the rather complex time domain data from the AM output amplifier 40.

As is known, in addition to the separation into frequencies, the analysis performed by currently available frequency analyzers 42 will also result in the display of the relative amplitudes or strengths of the components of the various frequencies detected in the motor current signal. Such displays, which may be referred to as motor current signatures, are of great assistance to the user in the overall analysis of the motor and its load system.

Continuing with another embodiment of the invention in FIG. 1, the method for phase demodulation includes amplifying, again by means of the input amplifier 30, and the same filtering at the optional predetection filter 32. Thus conditioned, the raw motor current signal from predetection filter 32 is routed to the PM demodulator 36.

The phase demodulation, performed by phase demodulator 36, extracts frequency components which have caused phase modulation of the 60 Hz motor current signal. The PM demodulator may also generate an unwanted second harmonic frequency, and so also often requires a following step of low-pass filtering, which is done by the PM post-detection low-pass filter 44 shown in FIG. 1.

Again, because the frequency components which have caused phase modulation of the original motor load current are often extremely small, amplification of the derived time-domain motor current signal is required, and this step is performed by PM output amplifier 46. Thus amplified, the phase demodulated components of the motor current signal are presented to frequency analyzer 42 which computes the frequency spectrum of this data, and permits analysis of the phase demodulated frequencies by the user.

In a typical frequency analyzer 42, more than one signal input is provided. These inputs, denoted as Input A and Input B in FIG. 1, receive the AM and PM demodulated motor current signals respectively, and in accordance with the two embodiments of the present invention taught heretofore, are analyzed separately. It is a part of the present invention, and yet another embodiment however, to compare the AM demodulated time-domain motor current signal with the PM demodulated time-domain motor current signal directly.

The PM demodulation process also has the highly desirable attribute of being extremely insensitive to the amplitude noise and "spikes" in the motor load signal which are prevalent in many industrial environments. Such spikes could totally disable simple AM detectors (e.g., envelope or rectifier) and could even cause substantial interference to the operation of the more robust RMS and synchronous types in those applications.

The separation of AM and PM-induced modulation components is also very useful in the analysis of mechanical systems in determining the causal mechanism behind the various signals observed. In other words, most mechanical processes (or phenomena) will be evidenced by unique AM and PM spectra they produce. In general, the two spectra will be sufficiently different to permit selection identification of various components as being primarily either AM, PM, or both. Such information can be invaluable in determining the exact cause of each vibration-like component in the composite spectrum.

Figure 2:
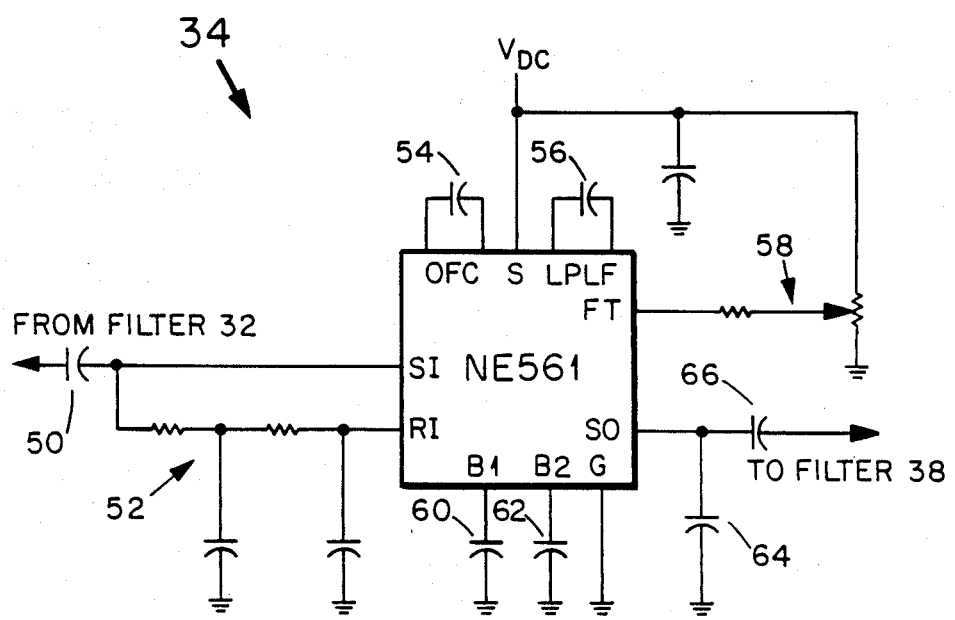
FIG. 2 is an electrical functional block diagram of a synchronous amplitude demodulator as embodied in the present invention.

Referring now to FIG. 2, a preferred embodiment of the synchronous AM demodulator circuit 34 of the present invention is described. Demodulator 34 is designed around a single special-purpose integrated circuit (IC). The particular device chosen was a NE561 manufactured by Signetics, Inc. The IC consists of a basic phase-locked-loop system building block with an additional multiplier circuit on board which is employed in the present invention for use in the synchronous AM demodulation function itself.

Taking FIG. 2 in more detail the input signal from predetection filter 32 is coupled through a capacitor 50 into the signal input pin SI on the integrated circuit device. The input signal is also routed through an RC phase-shifter network 52 into the reference input pin RI of the phase-locked-loop block of the integrated circuit. The RI input supplies a carrier phase reference voltage to the internal oscillator and phase comparator circuitry of the IC to provide a reference for the internal operation of the oscillator.

The additional components shown at the top of the IC are the oscillator frequency control capacitor 54 coupled between the two OFC timing pins, the supply pin S which receives the DC bias voltage $V_{DC}$ to the device, and the loop bypass filter 56 which is connected between the low-pass loop filter pins LPLF. The filter 56 controls the acquisition and lock-in operations of the phase locked loop and its transient (time) response.

A potentiometer resistor network 58 connected to the fine tuning pin FT on the device forms the fine tuning network which permits relatively small changes of oscillator frequency within the chip in order to closely approximate the nominal 60 Hz input frequency to the chip.

Capacitor 60 from pin B1 to ground and capacitor 62 from pin B2 to ground are bypass capacitors designed to stabilize the operation of the chip. Pin G is the ground connection of the device. There is an output filter capacitor 64 from the demodulated AM signal output pin SO, and a large coupling capacitor 66 blocks the output DC component and connects the synchronous AM demodulated signal to the AM post detection low pass filter 38.

In the operation of the synchronous AM demodulator 34, the phase-locked-loop block, as in all phase-locked loop systems, includes a voltage-controlled oscillator free-running frequency is set to approximate that of the input signal. When the input signal is present at the phase comparator block, the phase comparator compares the actual phase of the input signal to that of the voltage-controlled oscillator.

Any difference in phase between the two results in an error voltage which is fed back into the frequency-determining circuit of the voltage-controlled oscillator and therefore adjusts its frequency as required to bring the phase error back to zero. This operation then provides the dynamic oscillator control for the device.

The final operation within the IC is that of analog signal multiplication, which occurs in the multiplier block when the input signal at pin SI is internally multiplied with the voltage-controlled oscillator signal. The resultant AM demodulated output then appears on pin SO.

Figure 3:
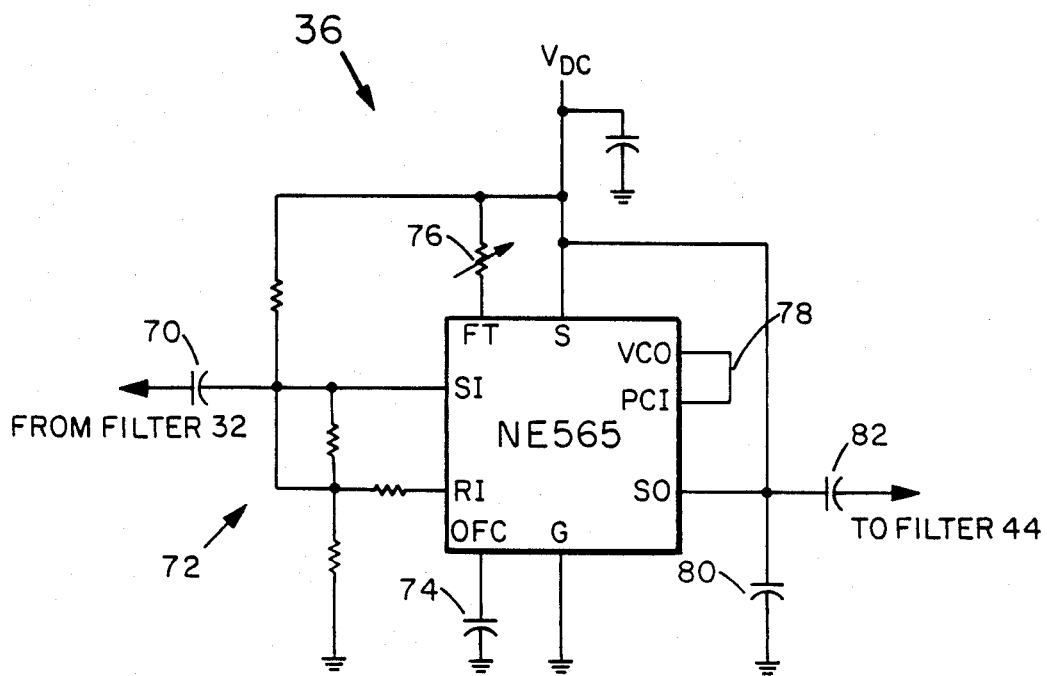
FIG. 3 is an electrical functional block diagram of a phase demodulator as embodied in the present invention.

FIG. 3 illustrates a preferred embodiment of the phase demodulator circuit 36 of the invention. Like demodulator 34, it also utilizes a phase locked loop building block integrated circuit. The particular model used is the NE565 from Signetics, Inc. The NE565 is a more general purpose IC, and operates similarly to the previously described NE561 except that it does not contain the additional multiplier block.

In FIG. 3, the input signal from the predetection filter 32 is introduced through an input coupling capacitor 70 into pin SI, the signal input to the NE565 device. The four resistors 72 associated with pins SI and RI on the IC are input biasing resistors used to set the appropriate DC operating levels to the signal input SI and reference input RI of the device.

The capacitor 74 from pin OFC to ground is the oscillator frequency-control capacitor which serves a comparable function to capacitor 54 on the NE56-1, namely setting the approximate free-running frequency of the internal voltage-controlled oscillator.

A tuning potentiometer 76 between the positive supply voltage and pin FT of the device provides fine tuning of the oscillator frequency. Pin S is the supply voltage pin, and pin G is the ground connection for the device.

The input signal has its phase compared with the voltage-controlled oscillator phase in the chip internally. The voltage-controlled oscillator output appears at pin VCO. That pin is jumpered to the input of the phase comparator at pin PCI by means of the lead 78. The other input of the phase comparator is connected internally to pin SI, the signal input pin.

The error voltage in the loop appears at pin SO. The phase-demodulated output signal from the PM demodulator 36 thus appears at pin SO. There is an output filter capacitor 80 connected to ground from pin SO, and the output signal is coupled through a large coupling capacitor 82 to filter 44, the post-detection low pass filter.

With reference again to FIG. 1, the operation of the invention is briefly recounted. The current probe 24, as heretofore described, is the source of a replica current proportional to the actual current supplied to the motor 20. This replica current on lead 28 provides the input signal to the present invention. The input amplifier 30 of the invention provides a variable gain function and permits the input signal level to be matched to the needs of the rest of the circuit.

The optional predetection filter 32 may be either a low-pass or bandpass type, depending on the application. Filter 32 is basically used to constrain the input frequency supplied to the demodulators 34 and 36 to the region of interest.

In one example, the spectrum is assumed to be centered at 60 Hz, the nominal U.S. power line frequency, and contains frequencies of interest within a band ranging 30 Hz above and below 60 Hz. Thus, continuing with this example, the frequency spectrum that is passed by the predetection filter 32 would range nominally from 30 Hz to 90 Hz.

This signal is then applied to the synchronous AM demodulator circuit 34 which was earlier described as a phase-locked-loop-based synchronous detector. The phase-locked loop locks onto the 60-Hz carrier frequency in phase, and the oscillator signal which has been phase-locked to the 60-Hz carrier is then applied to one of two inputs to the multiplier block within the chip. The second input (SI) receives the input motor current signal and sends it to the multiplier circuit, which produces an output proportional to the product of the two input signals.

Along with the desired demodulated signal spectrum, undesired signals (artifacts) are produced in the demodulation process and these are present at the output of the AM demodulator along with the spectrum of interest. These undesired signals are filtered out in the post-detection low-pass filter 38. In the typical case, these artifacts are harmonics of the 60 Hz carrier, plus related frequencies. The nominal cutoff frequency of filter 38 is 30 Hz, which causes frequencies below 30 Hz to be passed on to the output amplifier 40 without attenuation, and frequencies above 30 Hz to be sharply attenuated within the filter 38.

The resultant filtered output signal then undergoes amplification and additional buffering within amplifier 40 in order to drive external circuits such as the frequency analyzer 42. The signal out of the amplifier 40 is thus the demodulated synchronous AM output signal of this invention.

Returning to the predetection filter 32, its output signal is also applied to the PM demodulator 36. Demodulator 36 is a standard phase-locked-loop-based device where the phase-locked loop error voltage is filtered and then utilized as the demodulated PM output.

As in the AM synchronous detector case, undesired signals (artifacts) are present along with the desired modulated signal spectrum at the output of the PM demodulator 36. Another post-detection filter 44 identical or similar to filter 38 is utilized to filter out all but the frequencies of interest, in this case frequencies in the desired range of 0–30 Hz. As in the AM channel, the output of the filter 44 is applied to an output amplifier 46, resulting in the final demodulated PM signal output, which also goes to the frequency analyzer 42.

In this example, both the AM and PM demodulated signals have spectra that reside between DC and 30 Hz, although typically the DC is blocked by capacitive coupling prior to the low pass filters 38, 44. The output amplifiers 40 and 46 provide the opportunity to apply additional amounts of amplification to assist in the detection of very low level components which otherwise might not be of usable magnitude.

Figure 4:
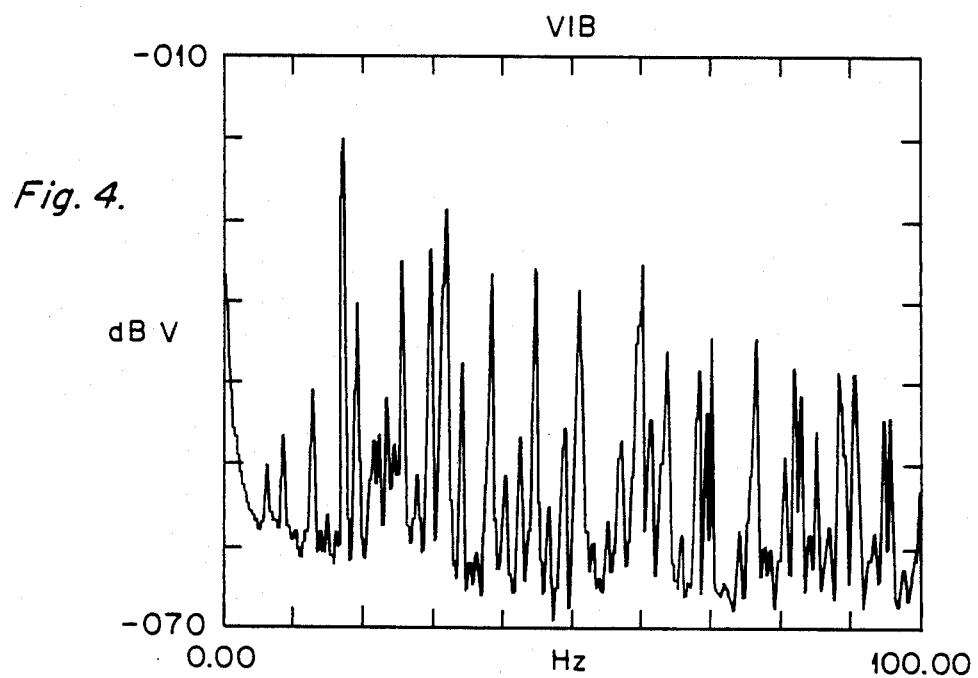
FIG. 4 is a frequency spectrum of an electric motor operated vacuum pump obtained from a vibration sensor.
Figure 5A:
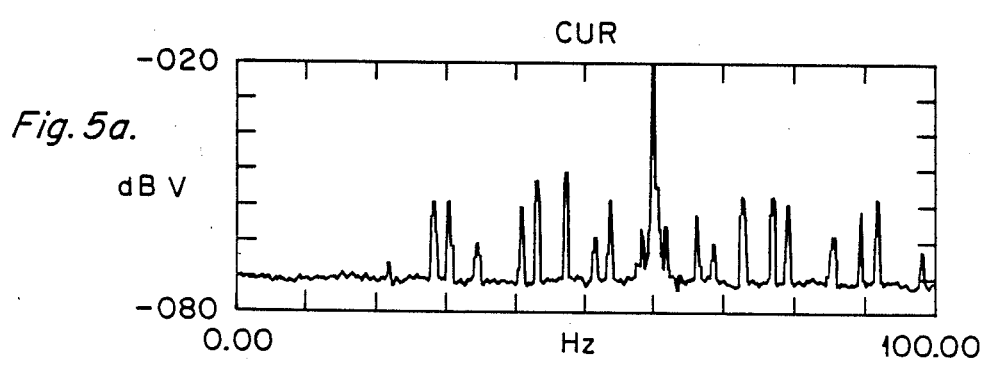
FIG. 5a is a frequency spectrum of the vacuum pump of FIG. 4 obtained from a current probe.
Figure 5B:
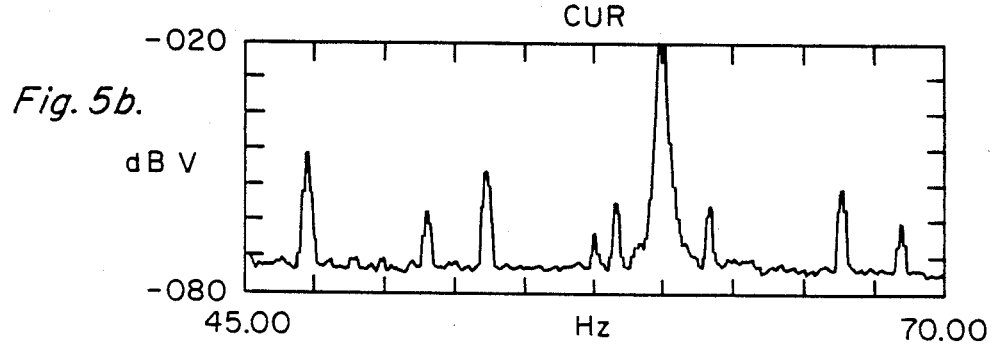

For purposes of background and comparison, FIG. 4 shows the results from conventional spectrum analysis obtained from an accelerometer mounted on a vacuum pump. Each of the numerous peaks in FIG. 4 represents some particular mechanical characteristic of the vacuum pump load. The motor current spectral analysis of the vacuum pump is shown in FIG. 5a which shows the raw current as detected by a current probe clipped onto a lead somewhere in the motor circuit. The 60-Hz peak represents the line frequency which is the most prominent in amplitude and extends offscale in this particular plot, with all the smaller peaks being the modulating frequencies produced by the motor load. FIG. 5b is an expanded plot around 60 Hz to show the neighboring peaks in somewhat more detail. Each of these peaks reflects a particular part of the load, which is shown even more clearly using the demodulators of this invention.

Figures 6, 7:
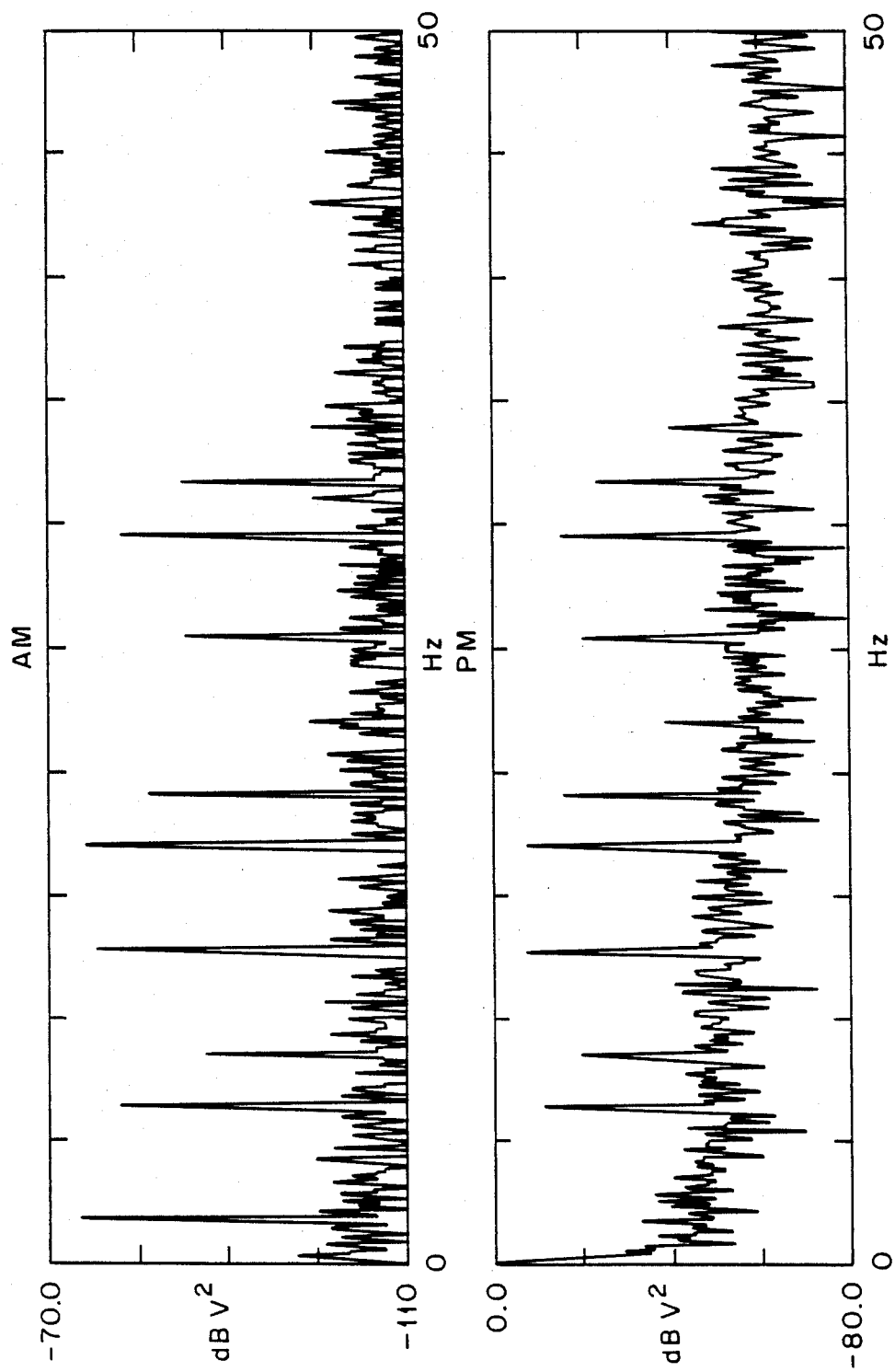

FIG. 6 shows the amplitude demodulated signal from this same vacuum pump. The signals have been limited to a 0–50 Hz spectrum of the demodulator output. Here, the lowest frequency peak is the slip frequency which is proportional to the difference between the actual motor speed and the theoretical synchronous speed. In this case, because of the number of poles in the motor, there is a multiplying factor of four. Thus, four times the slip frequency is observed, providing an accurate measure of motor speed from this single peak. The motor speed also appears as the prominent peak just below 30 Hz which is the loaded speed of the nominally 30 Hz (1800 rpm) motor. In addition, there are sharp peaks due to the belt at 6.4 Hz and multiples thereof. These occur even up to 5 multiples (5 harmonics) of the belt speed. The same is true of the pump itself, which is rotating at a different speed from the motor and has a different period from that of the belt. The fundamental pump frequency is about 8 Hz. Second, third and fourth harmonics of that frequency are also observed.

These same peaks are also observed in the phase-demodulation signature (FIG. 7) of the same vacuum pump. In the case of FIG. 7, the slip frequency does not show up nearly as strongly as in the amplitude demodulation case. All of the other frequencies—the belt frequency, the fundamental pump frequency, the motor speed, and harmonics of these—show up in the phase demodulation plot of FIG. 7. It may be noted that the amplitudes are different, but at this point the exact explanation for these differences is not fully known. The vacuum pump makes a good demonstration of this demodulation circuit in that the modulating frequencies are quite strong, compared with some other measured systems.

Figures 8, 9:
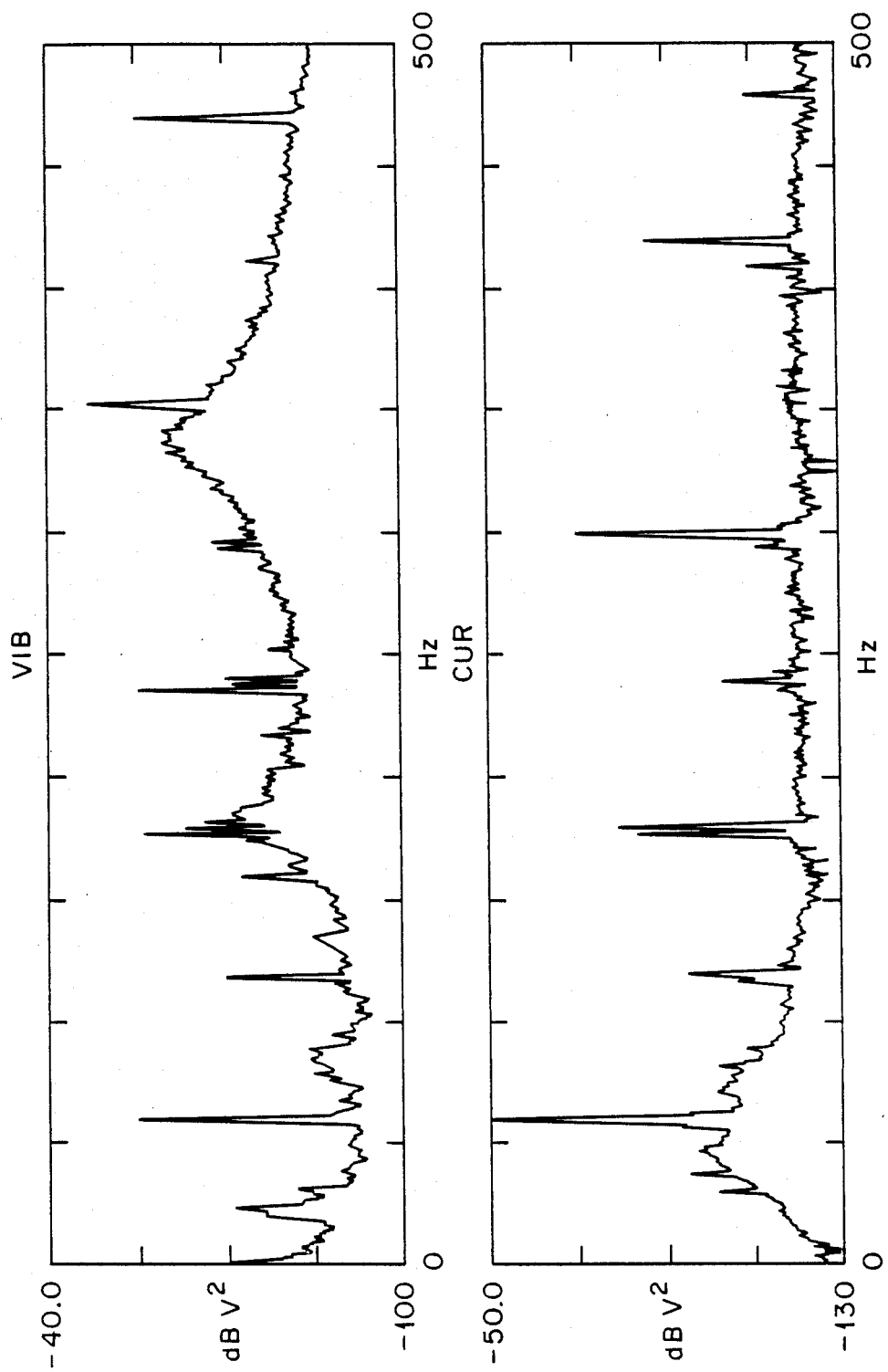
FIG. 8 is a frequency spectrum of an electric motor operated centrifugal pump obtained from a vibration sensor.
FIG. 9 is a frequency spectrum of the centrifugal pump of FIG. 8 obtained from a current probe.

The demodulators are sufficiently sensitive, however, to detect modulated spectra in other equipment which is not so strongly modulated. In the vacuum pump example, the high sensitivity of the demodulators is not absolutely necessary, but in other equipment applications it can be essential. For instance, a centrifugal pump is characterized in the plots of FIGS. 8–11. FIG. 8 is a 0–500 Hz vibration spectrum obtained from an accelerometer mounted on a small centrifugal pump which is pumping water. Several distinctive peaks are visible in the plots. The raw motor current spectrum of FIG. 9 again covers a 0–500 Hz span, acquired from a clip-on probe sampling one of the motor leads to the centrifugal pump assembly. This system employs direct drive, so the motor speed and the pump speed are identical.

Figures 10, 11:
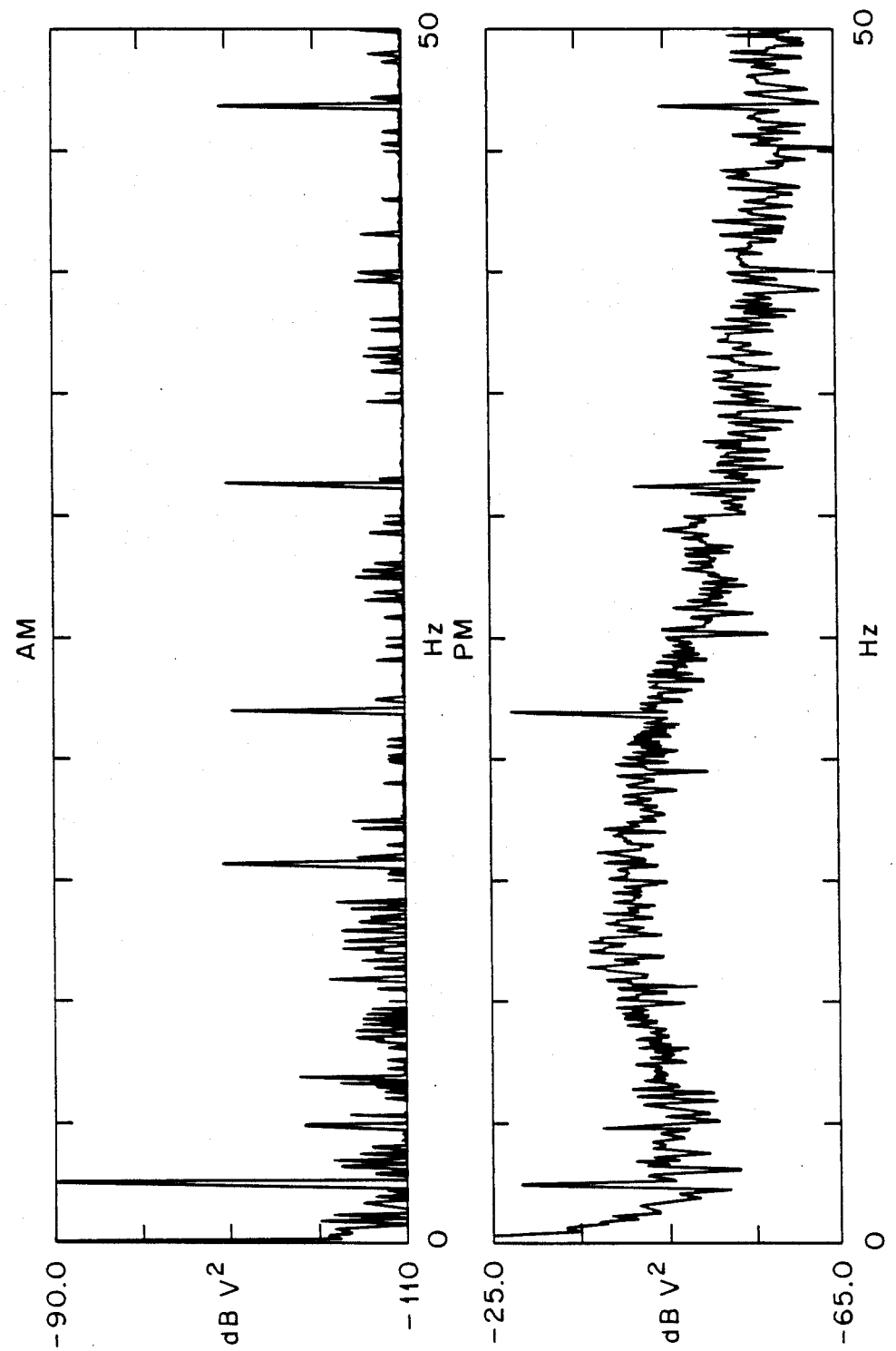
FIG. 10 is an AM demodulated frequency spectrum according to the present invention of the centrifugal pump current probe of FIG. 9.
FIG. 11 is a PM demodulated frequency spectrum according to the present invention of the centrifugal pump current probe of FIG. 9.

FIGS. 10 and 11 are the demodulated current spectra for the centrifugal pump. The amplitude demodulation spectrum in FIG. 10 again shows numerous characteristic frequencies. The highest amplitude (at approximately 2.4 Hz) is proportional to a slip frequency, again related to the load. It is the difference between the actual motor speed and the synchronous speed, times the number of poles. In this case, the motor is a two-pole type, and thus the peak appears at twice the difference between the actual motor speed and synchronous speed. A number of smaller peaks approaching the background level of the measurement system are evident in FIG. 10 but have not yet been fully explained.

Note the extremely low modulation amplitudes involved. The noise level of the measurement setup is known to be about 100 db below 1 V rms (roughly 10 microvolts), yet the demodulator itself is still sensitive to components down in this range. The phase-demodulation spectrum in FIG. 11 also shows the slip frequency present, again at 2.4 Hz. It is a lower-level signal than in the amplitude demodulated spectrum, as was also the case in the vacuum pump example. The broad background in this case is somewhat higher in amplitude than the amplitude demodulation spectrum. This is probably due to some flow noise but this has not been fully explored. Again, the salient difference between these centrifugal pump spectra and the vacuum pump spectra is the lower amplitudes of the modulating signals, yet, they are still detectable with the AM and PM demodulators.

This sensitivity improvement provided by the present invention can probably best be illustrated by means of several calibration spectra taken in the laboratory. Instead of using a motor which usually has a number of modulating frequencies present, in the calibration experiments a single modulating frequency was used to avoid any confusion among the several typical sources of modulation. It was demonstrated that although the spectrum analyzer would fail to display the modulating sidebands at a level of roughly 60 to 65 dB below the 60 Hz carrier frequency signal, the demodulators could easily extract these sidebands, even though they were invisible in the original spectrum. In fact, the sidebands were still detectable at levels at least 20 db below the level of visibility in the original spectrum; in other words although a modulating signal when viewed through a typical high-quality spectrum analyzer would disappear in the original signal at about 60 db below the carrier, the demodulator circuits were able to detect it (at both the phase demodulation and amplitude demodulation outputs) at levels of 80 to 100 dB below the carrier, an improvement of 20 to 40 dB in effective sensitivity. This represents a factor of one hundred thousand below the amplitude of the original carrier frequency.

This extreme detection sensitivity makes the invention's utility as a monitor of machine characteristics probably the most efficient way possible of detecting the typically small levels of modulation present in the vast majority of electric motor-driven systems. Indeed, it is very difficult to detect signals this low in amplitude via vibration-sensing devices such as proximity probes, or accelerometers. Additionally, such instruments often pick up stray signals (due to floor vibrations, for instance) while the motor-current-signals are essentially immune to said effects.

It is generally recognized by those skilled in the communications art that frequency modulation (FM) is actually just the time integral of PM; since in the instant case static FM of the AC power source is not observed, the arguments offered herein concerning PM demodulation and analysis should be construed as convering FM analysis, since both modulation forms are intimately related forms of a generalized "angle" modulation process. Practically, PM is of greater usefulness since its spectral response to induced angle-modulated components in the motor current is flat, whereas an FM detector will respond to the same signals with an output signal which will be the time-integral of the PM-demodulated output; i.e., with an amplitude response which possesses a constantly decreasing output proportional to frequency. Such a characteristic generally impedes useful analysis of the full demodulated spectrum (particularly the higher frequencies) and thus will not be further discussed.

From the foregoing, it will be understood that improved circuits for obtaining motor current spectral analyses have been developed. The circuits described herein have particular applications for analyzing motor current signals from a large variety of electric motor driven systems, particularly mechanical load systems that AM modulate and/or PM modulate the motor current signal.

However, the circuits are not limited by these applications, since these are given only as illustrations of the applications to which the circuits apply. Rather, the circuits of the present invention are to be limited only by the appended claims and their equivalents when read in combination with the foregoing detailed description.

What is claimed is:

1. A method of obtaining frequency-domain motor current signatures comprising the steps of:
   amplifying a time-domain motor current signal;
   synchronously AM demodulating said amplified signal to obtain a derived time-domain motor current signal;
   low-pass filtering said derived signal;
   amplifying said filtered derived signal; and
   computing the frequency spectrum of said filtered derived time-domain motor current signal.

2. A method of obtaining frequency-domain motor current signatures comprising the steps of:
   amplifying a time-domain motor current signal;
   PM demodulating said amplified signal to obtain a derived time-domain motor current signal;
   low-pass filtering said derived signal;
   amplifying said filtered derived signal; and
   computing the frequency spectrum of said filtered derived time-domain motor current signal.

3. The method, as recited in claim 1, comprising the further step of filtering said amplified time-domain motor current signal before it is synchronously AM demodulated.

4. The method, as recited in claim 2, comprising the further step of filtering said amplified time-domain motor current signal before it is PM demodulated.

5. A method of obtaining frequency-domain motor current signatures comprising the steps of:
   amplifying a time-domain motor current signal; synchronously AM demodulation said amplified time-domain motor current signal to obtain a derived time-domain motor current signal;
   low-pass filtering said derived signal;
   amplifying said filtered derived signal;
   PM demodulating said amplified time-domain motor current signal to obtain a second derived time-domain motor current signal;
   low-pass filtering said second derived signal;
   amplifying said filtered second derived signal;
   computing the frequency spectrum of said filtered derived signal;
   computing the frequency spectrum of said filtered second derived signal; and comparing said frequency spectrum of said filtered derived signal with said frequency spectrum of said filtered second derived signal.

6. A system for obtaining frequency-domain motor current signatures comprising:
a signal conditioner including an input amplifier for amplifying a time-domain motor current signal;
a synchronous AM demodulator connected to said input amplifier for obtaining a synchronously AM demodulated motor current signal;
a low-pass filter connected to said AM demodulator for removing unwanted frequencies from said AM demodulated signal;
an output amplifier connected to said filter for amplifying said AM demodulated signal; and
a frequency analyzer connected to said output amplifier for computing the frequency spectrum of said AM demodulated motor current signal.

7. A system for obtaining frequency-domain motor current signatures comprising:
a signal conditioner including an input amplifier for amplifying a time-domain motor current signal;
a PM demodulator connected to said input amplifier for obtaining a PM demodulated motor current signal;
a low-pass filter connected to said PM demodulator for removing unwanted frequencies from said demodulated signal;
an output amplifier connected to said filter for amplifying said PM demodulated signal; and
a frequency analyzer connected to said output amplifier for computing the frequency spectrum of said PM demodulated motor current signal.

8. The apparatus of claim 6 wherein said signal conditioner further comprises a predetection filter coupled between said input amplifier and said synchronous AM demodulator.

9. The apparatus of claim 7 wherein said signal conditioner further comprises a predetection filter coupled between said input amplifier and said PM demodulator.

10. The apparatus of claim 6 wherein said input amplifier is a differential amplifier.

11. The apparatus of claim 7 wherein said input amplifier is a differential amplifier.

12. A system for obtaining frequency-domain motor current signatures comprising:
a signal conditioner including an input amplifier for amplifying a time-domain motor current signal;
a synchronous AM demodulator connected to said input amplifier for obtaining a synchronously AM demodulated motor current signal;
a low-pass filter connected to said AM demodulator for removing unwanted frequencies from said AM demodulated signal;
an output amplifier connected to said filter for amplifying said AM demodulated signal;
a PM demodulator connected to said input amplifier for obtaining a PM demodulated motor current signal;
a second low-pass filter connected to said PM demodulator for removing unwanted frequencies from said PM demodulated signal;
a second output amplifier connected to said second low pass filter and amplifying said PM demodulated signal; and
a frequency analyzer connected alternately to said output amplifier for computing the frequency spectrum of said AM demodulated motor current signal, and to said second output amplifier for computing the frequency spectrum of said PM demodulated motor current signal.

13. The apparatus of claim 12 wherein said signal conditioner further comprises a predetection filter coupled between said input amplifier and said synchronous AM demodulator and said PM demodulator.

14. A system for obtaining frequency-domain motor current signatures comprising:
means for amplifying a time-domain motor current signal;
means coupled to said amplifying means for synchronously AM demodulating said motor current signal to obtain a derived time-domain motor current signal; means coupled to said demodulating means for low-pass filtering said derived motor current signal;
means coupled to said filtering means for amplifying said filtered derived motor current signal; and
means coupled to said derived motor current signal amplifying means for transforming said derived time-domain motor current signal into a frequency spectrum.

15. A system for obtaining frequency-domain motor current signatures comprising:
means for amplifying a time-domain motor current signal;
means coupled to said amplifying means for PM demodulating said motor current signal to obtain a derived time-domain motor current signal; means coupled to said demodulating means for low pass filtering said derived motor current signal;
means coupled to said filtering means for amplifying said filtered derived motor current signal; and
means coupled to said derived motor current signal amplifying means for transforming said derived time-domain motor current signal into a frequency spectrum.

16. The system as defined in claim 14 further comprising:
means coupled between said amplifying means and said AM demodulating means for filtering said motor current signal prior to said AM demodulating.

17. The system as defined in claim 15 further comprising:
means coupled between said amplifying means and said PM demodulating means for filtering said motor current signal prior to said PM demodulating.

18. A system for obtaining frequency-domain motor current signatures comprising:
means for amplifying a time-domain motor current signal;
means coupled to said amplifying means for synchronously AM demodulating said motor current signal to obtain a derived time-domain motor current signal;
means coupled to said AM demodulating means for low-pass filtering said derived motor current signal;
means coupled to said low-pass filtering means for amplifying said filtered derived motor current signal;
means coupled to said amplifying means for PM demodulating said motor current signal to obtain a second derived time-domain motor current signal;

means coupled to said PM demodulating means for low-pass filtering said second derived motor current signal;

means coupled to said second low-pass filtering means for amplifying said filtered second derived motor current signal;

means coupled to said derived motor current signal amplifying means for transforming said derived time-domain motor current signal into a frequency spectrum; and means coupled to said second derived motor current signal amplifying means for transforming said second derived time-domain motor current signal into a frequency spectrum.

* * * * *